US005476039A

United States Patent [19]
Hiruta et al.

[11] Patent Number: 5,476,039
[45] Date of Patent: Dec. 19, 1995

[54] SCREEN PRINTING APPARATUS WITH MAGNETIC SUPPORT MEANS FOR PRINTING PLATE

[76] Inventors: Kengo Hiruta, 12-2-603 Kyonan-cho 2-chome, Musashinoeshi, Tokyo, Japan; Young S. Kim, 206-138, ChonNong 4 Dong, DongDaeMoon-Ku, Seoul, Rep. of Korea

[21] Appl. No.: 328,867

[22] Filed: Oct. 25, 1994

[30] Foreign Application Priority Data

Aug. 10, 1994 [JP] Japan ................. 6-188502

[51] Int. Cl.⁶ .................. B41F 15/34; B41F 15/18
[52] U.S. Cl. ............... 101/123; 101/126; 101/127; 101/128; 101/389.1
[58] Field of Search ..................... 101/123, 127, 101/127.1, 128, 128.21, 128.4, 129, 115, 126, 389.1

[56] References Cited

U.S. PATENT DOCUMENTS

| 4,072,920 | 2/1978 | Wright | 101/389.1 |
| 4,566,938 | 1/1986 | Jenkins et al. | 101/348 |
| 4,587,900 | 5/1986 | Oshio | 101/389.1 |
| 4,903,594 | 2/1990 | Ercole | 101/123 |
| 4,939,991 | 7/1990 | Szarka | 101/115 |
| 4,995,316 | 2/1991 | Kölblin et al. | 101/123 |
| 5,275,098 | 1/1994 | Larson | 101/123 |
| 5,282,416 | 2/1994 | Curtin | 101/123 |
| 5,375,517 | 12/1994 | Graener et al. | 101/129 |

Primary Examiner—Edgar S. Burr
Assistant Examiner—Lynn D. Hendrickson
Attorney, Agent, or Firm—Pearne, Gordon, McCoy & Granger

[57] ABSTRACT

The present invention relates to a screen printing apparatus comprising a support mechanism for supporting the material to undergo printing; a printing plate in which an ink penetrating portion is formed possessing the shape of the print; a printing plate housing for housing the printing plate at a position in contact with the material to undergo printing; a slider which is capable of bi-directional horizontal movement with respect to the printing plate; a slider driving mechanism for driving the slider bi-directionally; a first squeegee and a second squeegee for spreading over the printing plate ink supplied to the printing plate; and a squeegee switch mechanism installed in the slider for supporting the first squeegee and the second squeegee, and for selecting one of these first squeegee and second squeegee, and placing the selected squeegee in contact with the printing plate. In this manner, a sheet support mechanism for supporting a sheet; a plate unit formed from a printing plate and plate housing; and an ink imprinting mechanism are provided. The aforementioned ink imprinting mechanism comprises the aforementioned first squeegee and second squeegee; slider; a belt for moving the slider in both directions, and a first cylinder and second cylinder for raising and lowering each squeegee. The printing plate is formed from a material incorporating a ferromagnetic substance, and electromagnets and/or permanent magnets are arranged in the aforementioned sheet support mechanism.

11 Claims, 8 Drawing Sheets

SCREEN PRINTING APPARATUS WITH MAGNETIC SUPPORT MEANS FOR PRINTING PLATE

BACKGROUND OF THE INVENTION

1. Field of the Invention

The present invention relates to a screen printing apparatus, in particular, to an apparatus in which a squeegee is provided for uniformly providing ink to a printing plate.

2. Background Art

Screen printing is a process: for conducting printing by means of transferring ink which is passed through the ink penetrating portion of the printing plate to a sheet material by means of first placing the printing plate which is fixed within a housing onto the sheet material to undergo printing, filling the housing with printing ink, and then rubbing ink onto the printing plate using a spatula-shaped rubber material known as a "squeegee". The printing plate which is generally used is produced by means of forming a print layer such as a resist layer or the like onto a mesh screen which is woven using nylon, polyester, stainless steel, or the like, by means of a photochemical process. In this manner, the eyelets of this screen are partially blocked, thereby forming an ink penetrating portion in the shape of the print.

By means of screen printing, the ink maintained inside the ink penetrating portion of the printing plate is adhered to the sheet material by means of the squeegee, and thus a comparatively thick film can be formed corresponding to the thickness of the printing plate. With regard to this point, screen printing is superior to other printing methods such as letter-press printing, lithography, and the like. With a thick film, not only is three-dimensional printing possible, but also this film may be practically applied to the manufacture of etching resists and print substrates for use in semiconductor production. The technology for producing thick films can be applied to a wide range of fields, and thus there is a growing demand for this technology within various industrial fields. However, conventional screen printing apparatuses spread ink by means of moving the squeegee in only one direction after ink is placed on the printing plate. Therefore, if the thickness of the printing plate is increased to greater than the present state, it will be difficult to uniformly rub ink over the entire region of the ink penetrating portion formed in the printing plate. For example, according to the aforementioned method, disadvantages are generated such as smudging of the print at the section along the back-end edge of the ink penetrating portion with respect to the squeegee direction of movement due to an insufficient ink packing density.

It is an objective of the present invention to provide a screen printing apparatus which can uniformly pack ink into the ink penetrating portion, even in the case when the thickness of the printing plate is large, such that a printing image of a high precision possessing a large film thickness can be formed.

SUMMARY OF THE INVENTION

In order to achieve the aforementioned object, a screen printing apparatus according to the present invention is provided comprising:

a) a support mechanism for supporting the material to undergo printing;

b) a printing plate in which an ink penetrating portion is formed possessing the shape of the print;

c) a printing plate housing for housing the printing plate at a position in contact with the aforementioned material to undergo printing;

d) a slider which is capable of bi-directional horizontal movement with respect to the printing plate;

e) a slider driving mechanism for driving the slider bi-directionally;

f) a first squeegee and a second squeegee for spreading over the printing plate ink supplied to this printing plate; and g) a squeegee switch mechanism installed in the slider for supporting the aforementioned first squeegee and second squeegee, and for selecting one of a first squeegee and second squeegee, and placing this selected squeegee in contact with the printing plate.

At the time of using this screen printing apparatus, the material to undergo printing is originally placed onto the support mechanism for supporting the material to undergo printing. The printing plate which is housed by means of the printing plate housing is then arranged on top of this aforementioned material to undergo printing. Subsequently, ink is supplied to the printing plate, and the first squeegee is placed in contact with the printing plate by means of the squeegee switch mechanism. Ink is then rubbed and spread onto the printing plate using the first squeegee by means of moving the slider over its movement range from one end (i.e., first end) to the other end (i.e., second end) via the slider driving mechanism. At the other (second) end of the slider movement range, by means of the aforementioned switch mechanism, the first squeegee is withdrawn from the printing plate and replaced by the second squeegee; this second squeegee is placed in contact with the printing plate, and the ink remaining on the printing plate is then spread in the opposite direction by means of returning the slider to the first end from the second end of the movement range. In this manner, ink can be spread reciprocally (bi-directionally) by means of the first and second squeegees. Therefore, even in the case when the printing plate has a large thickness, the ink can be uniformly packed over the entire region of the ink penetrating portion of the printing plate to achieve high quality printing without smudges.

With respect to the aforementioned squeegee switch mechanism, the first squeegee and second squeegee can be connected such that tilting is possible by turning them in the direction of slider movement. In this case, at the time of spreading the ink, the rubbing effect of the ink onto ink penetrating portion of the printing plate can be further enhanced since the angle formed by each squeegee with the printing plate in the direction of progress of the respective squeegee is normally maintained as an acute angle.

It is also possible to form the aforementioned printing plate from a material incorporating a ferromagnetic substance, and install a magnetic force generating mechanism in the aforementioned support mechanism for attracting the aforementioned printing plate via the material to undergo printing. In this case, when imprinting the ink on the printing plate using a squeegee, the frictional force generated by the squeegee is large and hence misalignment between the printing plate and the material to undergo printing does not occur easily. In general, in the case when a thick printing plate is used, it is necessary to increase the squeegee pressure due to the poor adhesion of the printing plate to the material to undergo printing. However, by means of fixing the printing plate using magnetic force, printing can be conducted with a high precision while preventing misalignment and blotting/smudging of the print.

As the aforementioned magnetic force generating mechanism, it is possible to provide a plurality of electromagnets and a current supply means for supplying a current to these electromagnets. In this case, at the time of printing, the printing plate is fixed by turning on the current to the electromagnets, while, on the other hand, when separating the printing plate from the material to undergo printing, the peeling of the printing plate can be simplified by means of turning off the current to the electromagnets.

The ink penetrating portion of the aforementioned printing plate consists of openings forming the print pattern. It is possible to chamfer the peripheral edges of these openings at the contact side with the aforementioned squeegee. In this case, even when using a thick printing plate, ink flows easily into the interiors of the openings, thus further enhancing the effects of the present invention.

DETAILED DESCRIPTION OF THE PREFERRED EMBODIMENTS

Figure 1:
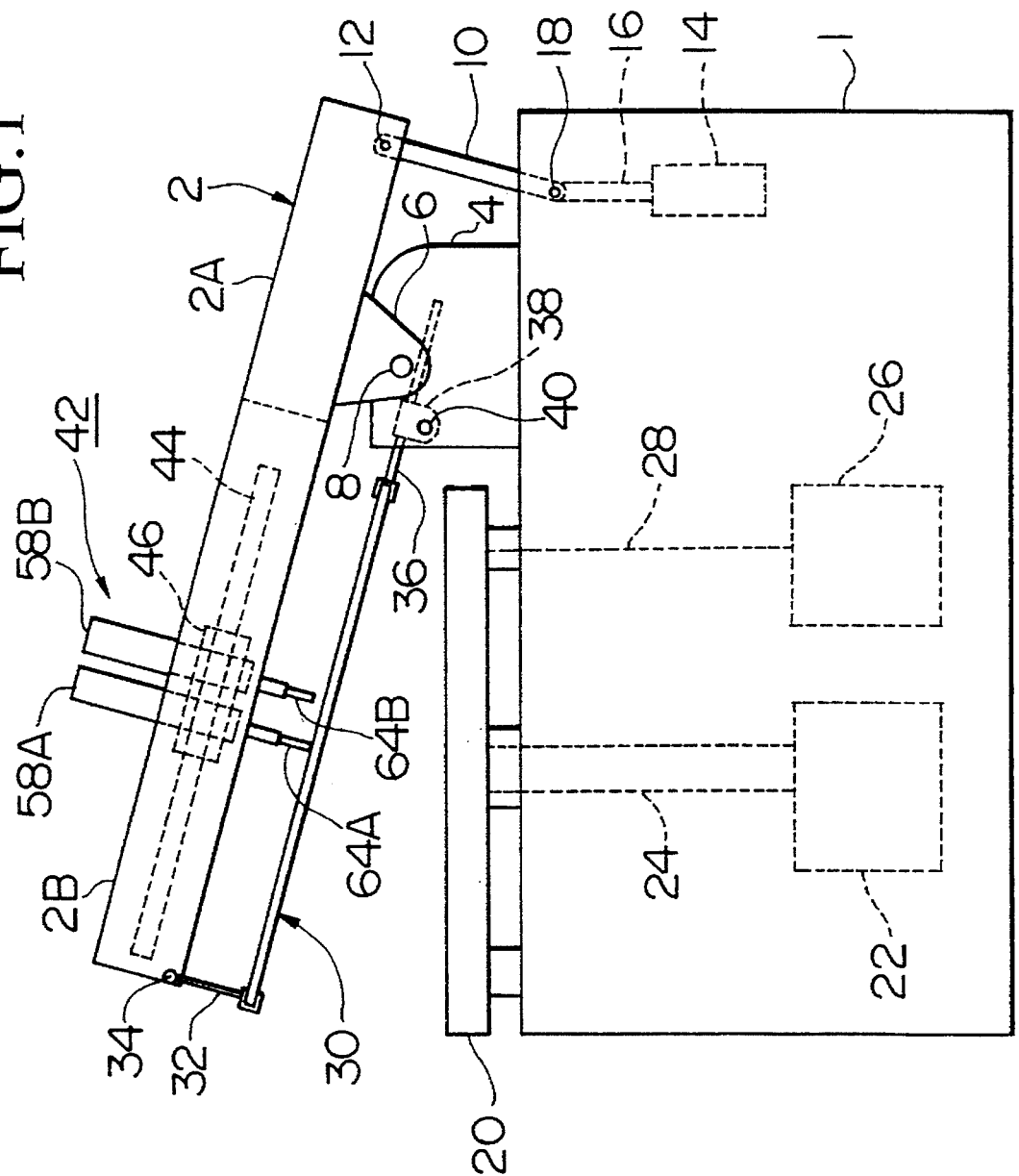
FIG. 1 shows a side view of a screen printing apparatus according to an embodiment of the present invention.
Figure 2:
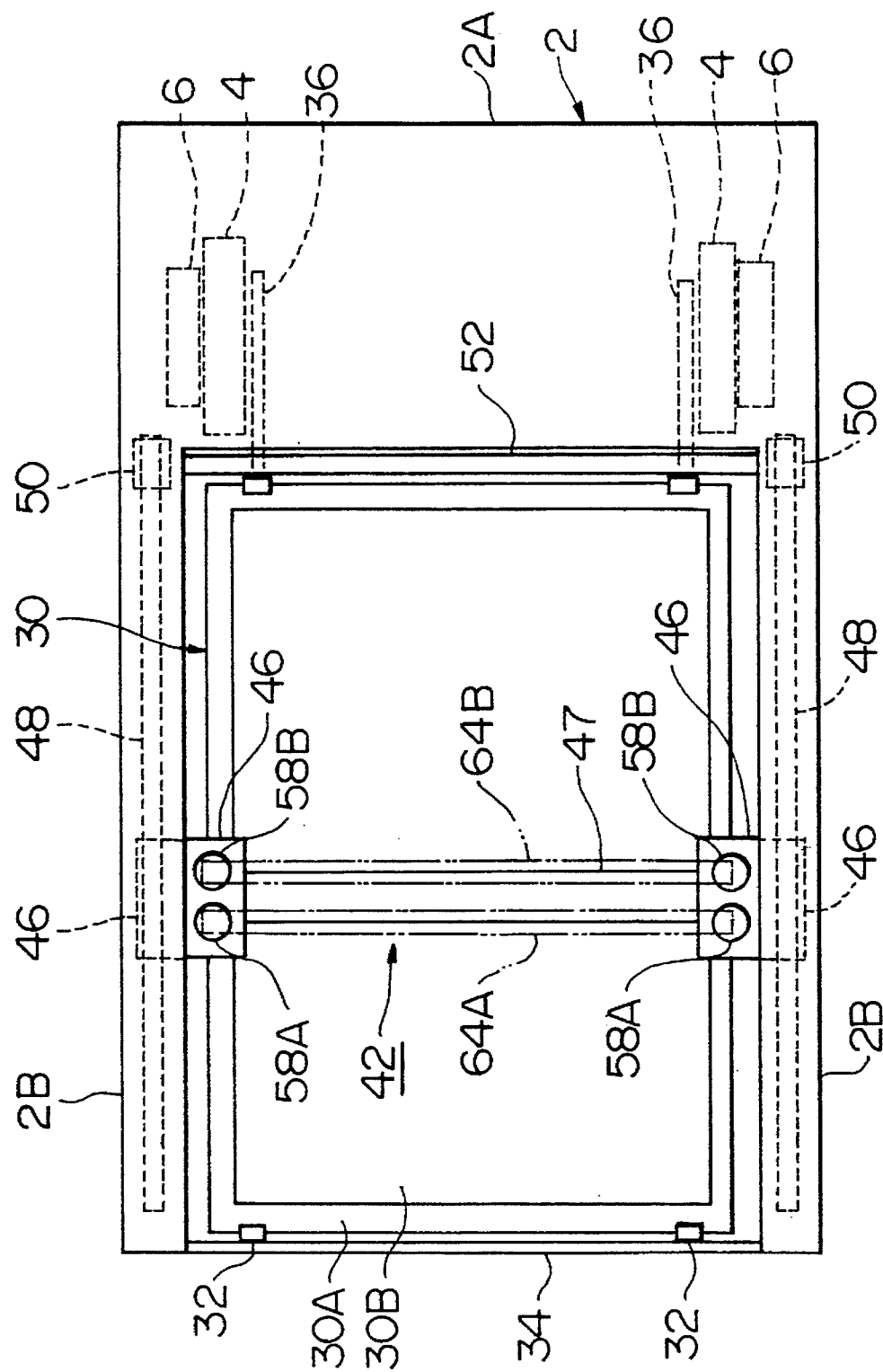
FIG. 2 is a plane view of the same embodiment.

FIGS. 1 and 2 are side and plane views, respectively, showing a screen printing apparatus according to an embodiment of the present invention. For the sake of explanation, the front of the apparatus corresponds to the left side, and the rear of the apparatus corresponds to the right side of FIG. 1. An outline of the apparatus will be explained in the following. In FIG. 1, a sheet support mechanism (support mechanism for material to undergo printing) 20 for supporting a sheet material to undergo printing (material to undergo printing) S is provided on the upper face of a main base 1. In addition, on the upper portion of this main base 1, an opening/closing base 2 is provided which can be vertically tilted at the rear portion therein. On the lower face of opening/closing base 2, a plate unit 30 is installed horizontally such that when opening/closing base 2 closes, the aforementioned plate unit 30 comes into contact with sheet S placed onto sheet support mechanism 20. In addition, an ink imprinting mechanism 42 is installed in opening/closing base 2 for rubbing ink onto printing plate 30B of plate unit 30.

In the following, the structure of each section mentioned above will be concretely explained.

From a planar perspective, opening/closing base 2 possesses a shape resembling a rectangle with one side removed in which a pair of arm portions 2B are provided extending from the right and left ends of the rectangular shaped base section 2A as shown in FIG. 2. At the rear end of the upper face of main base 1, a pair of support members 4 are formed in an upright state as shown in FIG. 1. Another pair of support members 6 formed on the lower face of base section 2A of opening/closing base 2 are connected to the aforementioned supporting members 4 at tilt axis 8 such that tilting is possible. Within main base 1, opening/closing cylinder 14 is housed facing upward such that one end of ring 10 is connected to rod 16 therein via axis 18 such that rotation is possible. The other end of ring 10 is connected to the rear end of opening/closing base 2 at axis 12 such that rotation is also possible. In this manner, by means of activating opening/closing cylinder 14, opening/closing base 2 is closed when rod 16 is extended, while this opening/closing base 2 is opened rod 16 is withdrawn. Furthermore, opening/closing cylinder 14 is designed to be controlled by means of a control panel (not shown in the Figures).

In between arm portions 2B of opening/closing base 2, plate unit 30 is arranged horizontally below these aforementioned arm portions (i.e., a space is provided thereinbetween). Plate unit 30 is constructed from plate housing 30A possessing a rectangular shape, and printing plate 30B placed within this aforementioned plate housing 30A. This entire plate unit 30 can be detached from the apparatus. In other words, a pair of brackets 32 are detachably fixed to the front end of plate housing 30A. These brackets 32 are connected to rod 34 spanning the front end of opening/closing base 2. In addition, a pair of brackets 36 are detachably connected to the rear end of the aforementioned plate housing 30A. These brackets 36 are installed in a slidable manner with respect to tilt portion 38. The dimensions of plate housing 30A can be modified by means of sliding these brackets 36. Tilt portion 38 is installed at axis 40 such that rotation is possible with respect to support member 4 of main base 1. When lifting the front end of opening/closing base 2, plate unit 30 is designed to be lifted in an approximate horizontal state with respect to opening/closing base 2.

Figure 3:
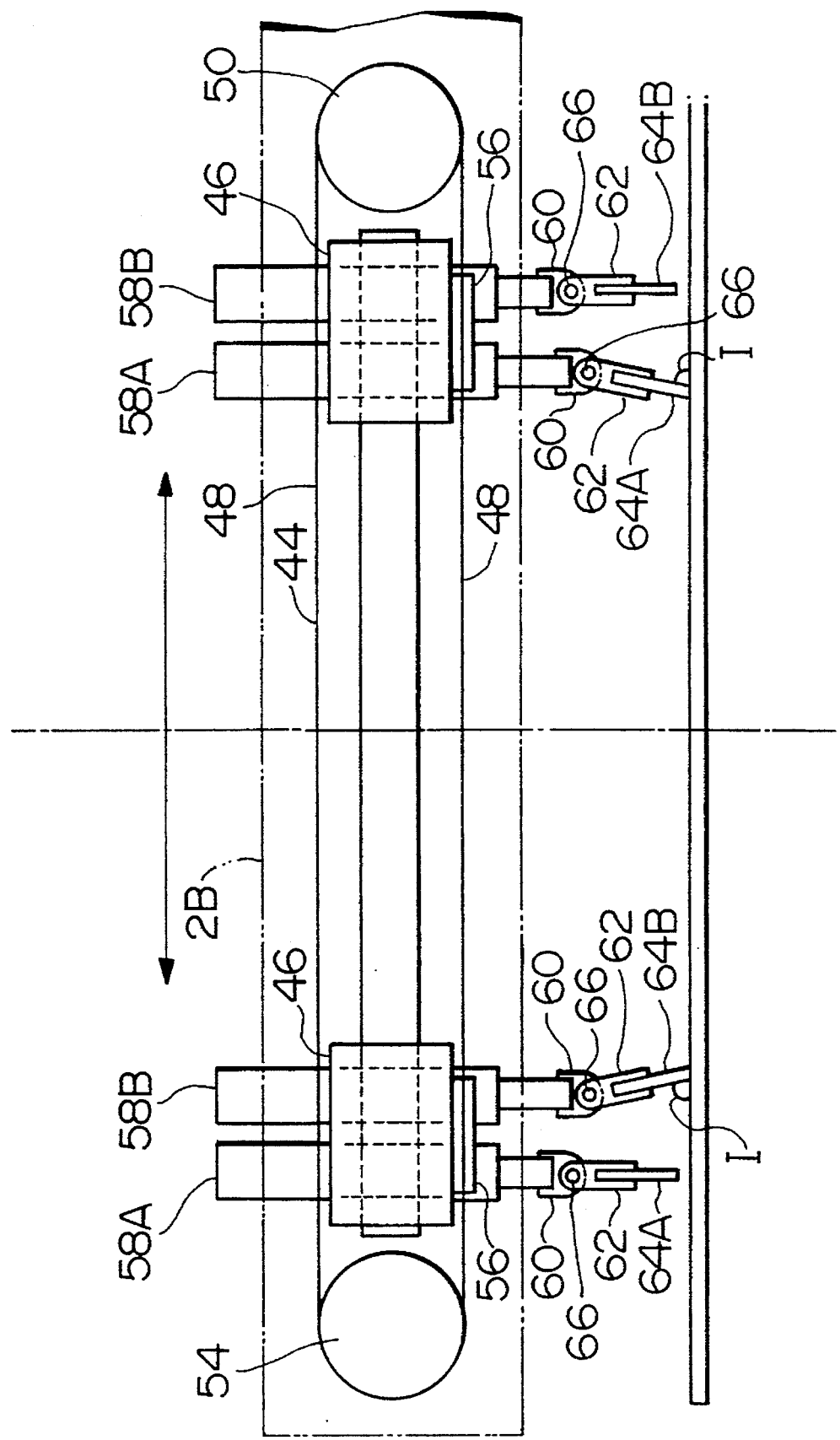
FIG. 3 is a side view showing an ink imprinting mechanism 42 according to the same embodiment.

Ink imprinting mechanism 42 consists principally of a pair of guide rods 44 housed horizontally within each arm portion 2B of opening/closing base 2; a pair of slider 46 installed in a slidable manner along each guide rod 44; and an endless belt (slider driving mechanism) 48 for driving these aforementioned sliders 46; first cylinder 58A and second cylinder 58B (squeegee switch mechanism) fixed in an upright state in each slider 46; and first squeegee 64A and second squeegee 64B which can be independently raised and lowered by means of these aforementioned cylinders 58A and 58B, as shown in FIGS. 2 and 3. As shown in FIG. 2, both sliders 46 are integrally connected by means of a long bridge portion 47 extending in the left/right direction. Each belt 48 is wound: between pulleys 50 and 54 which are respectively housed at the rear end and front end of arm portions 2B as shown in FIG. 3. The two pulleys 50 at the rear end are connected by means of shaft 52 which is designed to rotate reciprocally by means of a motor (not shown in the Figures). A section of each belt 48 is fixed to connecting portion 56 of slider 46 such that when belt 48 is rotated, sliders 46 and bridge portion 47 move as a single unit (integrally).

Cylinders 58A and 58B are installed in sliders 46 with their rods facing downward. Each cylinder 58A and 58B is connected to a fluid supply mechanism such as a compressed air source or pressure oil source housed within main base 1. This fluid supply mechanism undergoes pressure control by means of the aforementioned control panel.

At the lower end of each rod of cylinders 58A and 58B, a bracket 60 is respectively fixed. Between brackets 60 of first cylinder 58A and brackets 60 of second cylinder 58B, slender squeegee-fixing portions 62 are provided spanning the gaps therein, respectively, such that each rotates in the front/rear direction around axis 66.

Squeegee-fixing portion 62 possesses a slit extending in the longitudinal direction at the bottom end therein; a slender, plate-shaped squeegee is fixed in this aforementioned slit. First squeegee 64A corresponds to first cylinder 58A, while second squeegee 64B corresponds to second cylinder 58B. Each squeegee 64A and 64B is formed from an elastic material such as rubber with an entire length approximately equal to the width, in the right/left direction, of printing plate 30B.

Figure 4:
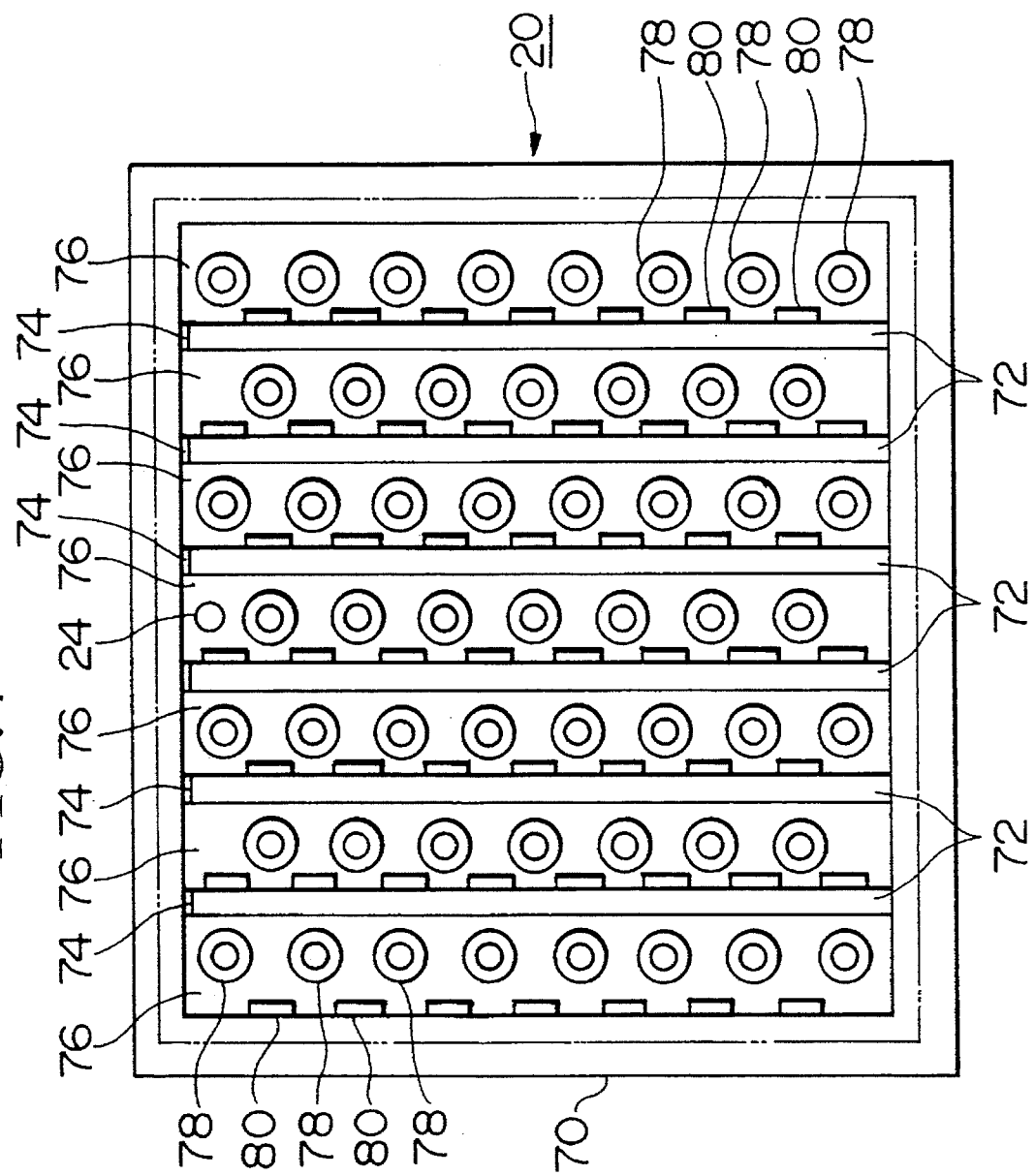
FIG. 4 is a plane view of sheet support mechanism 20 according to the same embodiment.
Figure 5:
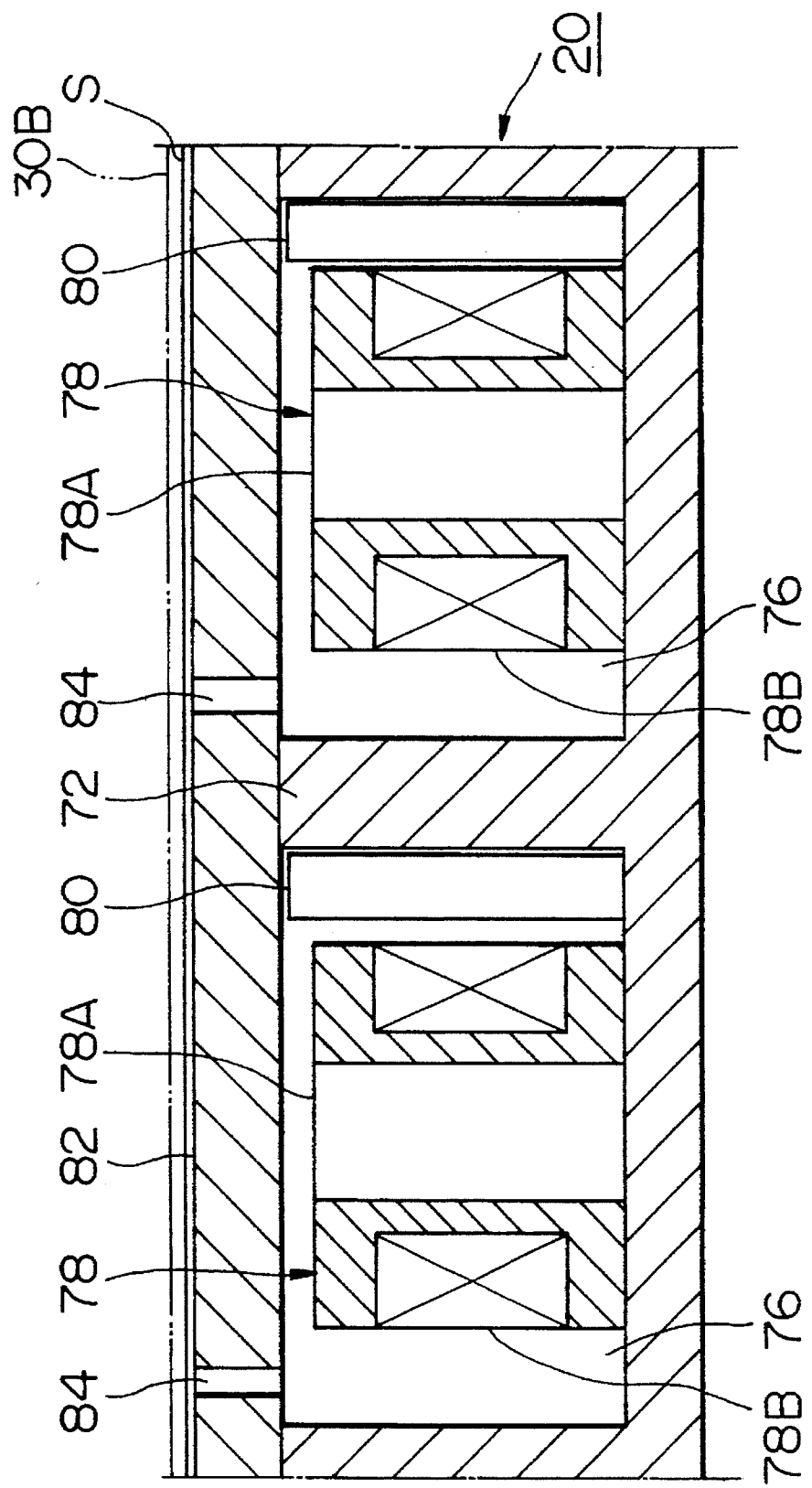
FIG. 5 shows a longitudinal cross section of the same sheet support mechanism 20.

As shown in FIG. 4, sheet support mechanism 20 is formed wherein diaphragms 72 are affixed horizontally in the interior of rectangular frame 70, thereby forming depressurized spaces 76 thereinbetween. These depressurized spaces 76 house electromagnets 78 and permanent magnets 80, and as shown in FIG. 5; the top face of frame 70 is sealed by means of sheet support plate 82 possessing a rectangular shape. As shown in FIG. 4, in a section of each diaphragm 72, vent holes 74 are formed in a manner such that all depressurized spaces 76 communicate reciprocally. Furthermore, a tube 24 is connected to the bottom face of frame 70 which communicates with the depressurized spaces 76. The other end of tube 24 connects to decompression pump 22 which is housed within main base 1 as shown in FIG. 1. As shown in FIG. 5, intake holes 84 communicating to each depressurized space 76 are formed at fixed intervals over the entire surface of sheet support plate 82. When decompression pump 22 is activated, air is simultaneously taken in from these intake holes 84 at once, and sheet S resting on top of sheet support plate 82 is fixed.

Electromagnet 78 is formed from cylinder 78A comprising a cylindrical-shaped drum portion with a pair of circular flange portions formed at both ends thereof, and a coil 78B which is wrapped around the aforementioned drum portion of cylinder 78A, as shown in FIG. 5. Cylinder 78A houses in its center a core of a soft magnetic material to which the magnetic force can be increased. The entire coil 78B is connected in series or in parallel, and communicates to electric mechanism 26 via cord 28 as shown in FIG. 1. This electric mechanism 26 is controlled by means of the aforementioned control panel.

Figure 6:
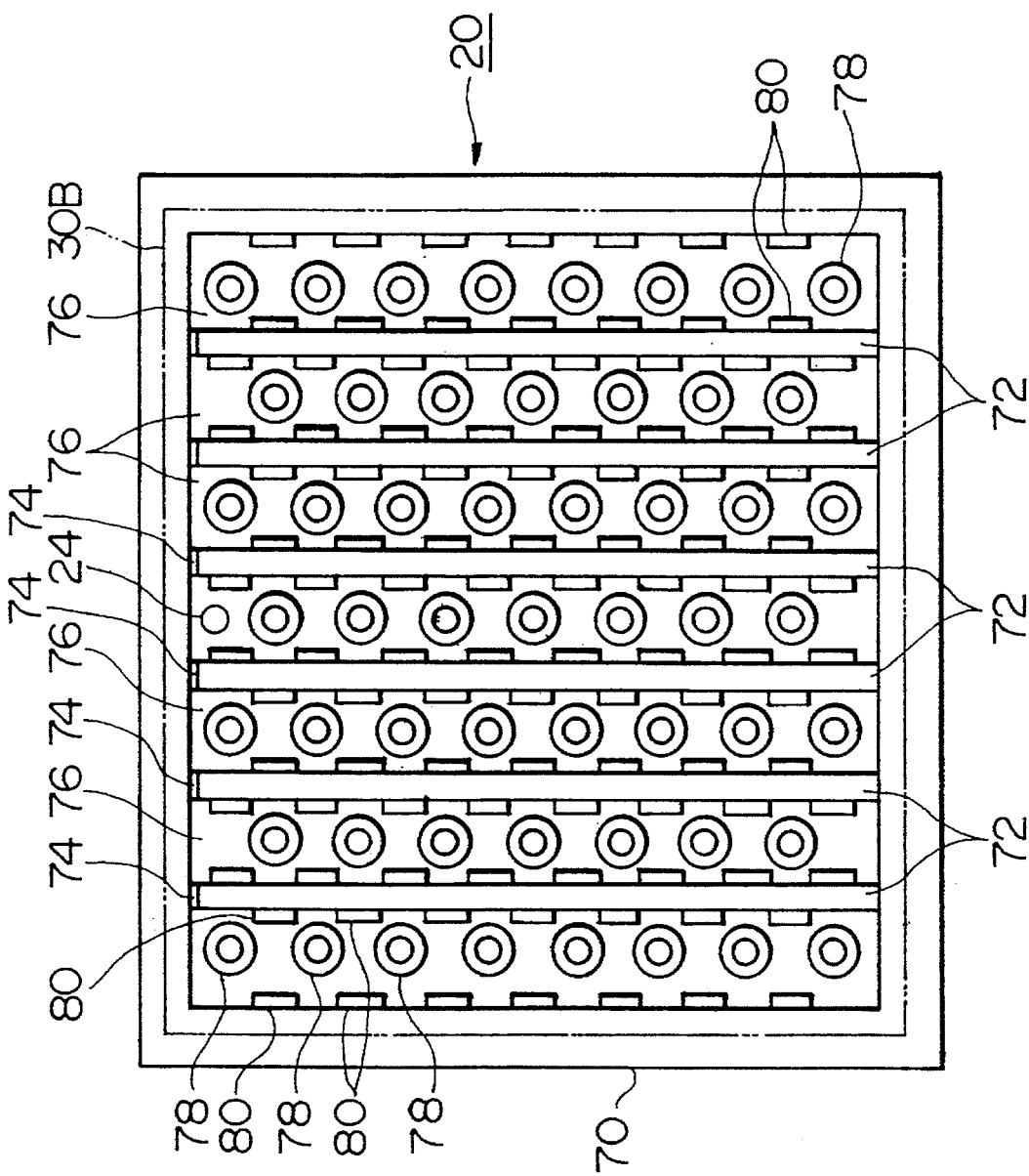
FIG. 6 is a plane view showing a modification of the above sheet support mechanism 20.

Permanent magnet B forms a rectangular body which is magnetized in either the vertical or horizontal direction in order to attract printing plate 30B. In the example shown in FIG. 4, these permanent magnets 80 are arranged on only one side of the electromagnets 78; however, as shown in FIG. 6, it is also possible to arrange these permanent magnets 80 on both sides of each electromagnet 78. Furthermore, it is also possible to achieve a structure in which only electromagnets 78 or permanent magnets 80 are provided within the depressurized spaces 76.

As seen from the examples shown in the Figures, in the case when both electromagnets 78 and permanent magnets 80 are provided, at the time of closing opening/closing base 2, printing plate 30B is lightly attracted and affixed by means of the magnetic force of permanent magnets 80. Thus, it is possible to prevent misalignment of the printing plate 30B which often accompanies the opening/closing of opening/closing base 2. On the other hand, at the time of printing, the printing plate 30B can be strongly attracted by means of adding the magnetic force of the electromagnets 78 to the magnetic force of the permanent magnets 80 by sending electricity to these aforementioned electromagnets 78. Therefore, even when rubbing of the printing plate 30B occurs from printing mechanism 42, it is possible to effectively prevent misalignment of the printing plate 30B. Furthermore, in the case when only electromagnets 78 are arranged within sheet support mechanism 20, it is possible to replace the function of permanent magnets 80 by means of normally passing electricity through a section of electromagnets 78.

As the aforementioned printing plate 30B, it is possible to employ (1) a printing plate formed by means of dispersing and affixing a ferromagnetic powder in a binding material, or (2) a printing plate in which openings are formed in a thin plate of a ferromagnetic substance.

As the material (1) in which a ferromagnetic powder has been dispersed and fixed in a binding material, it is possible to use a resin layer formed by means of adding a ferromagnetic powder to sections other than the ink-penetrating portion forming the print pattern of a mesh screen woven using synthetic fabric such as nylon, polyester, and the like, or metallic thread such as stainless steel thread, and the like. In this case, as the method for forming the aforementioned resin layer, a method can be appropriately employed in which an ink-penetrating portion is formed by means of adding a ferromagnetic powder to a conventional photoresist, applying this substance to the aforementioned screen, exposing this resultant material to the reverse print pattern, and then removing unnecessary sections therein. As the aforementioned ferromagnetic material, any conventional ferromagnetic material may be employed such as iron, cobalt, nickel, as well as alloys of the aforementioned, oxides of magnetic materials, compounds of magnetic materials, and the like. Furthermore, it is also possible to form the printing plate from a resin to which metallic powder has been added (including so-called "rubber magnets", "plastic magnets", and the like) while omitting the aforementioned mesh screen as long as a sufficient tensile strength can be obtained from just the resin. In this case, openings (ink-penetrating portion) in the shape of the print pattern are formed by means of etching or machine-working of the printing plate. In addition, it is also possible to form a mesh screen using a ferromagnetic substance.

Figure 9:
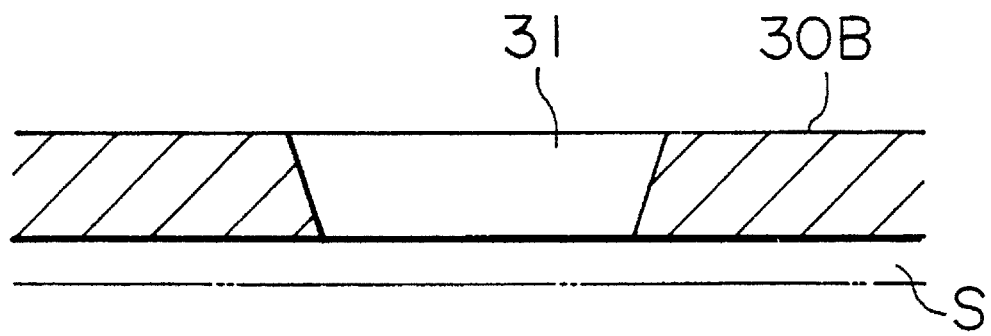
FIG. 9 is an enlarged cross sectional view showing a modification of printing plate 30B.
Figure 10:
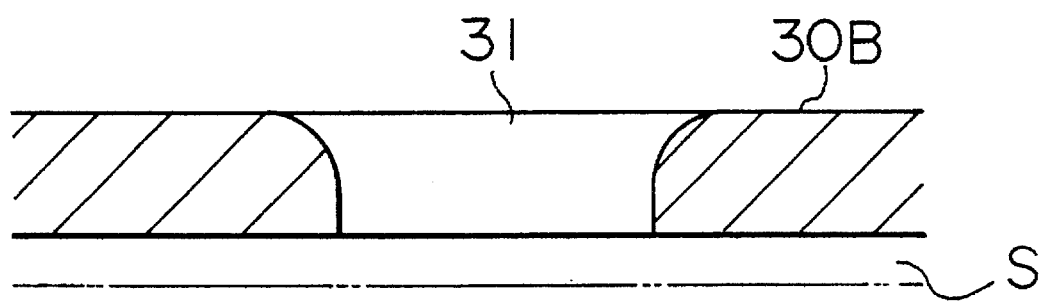
FIG. 10 is an enlarged cross sectional view showing a modification of printing plate 30B.
Figure 11:
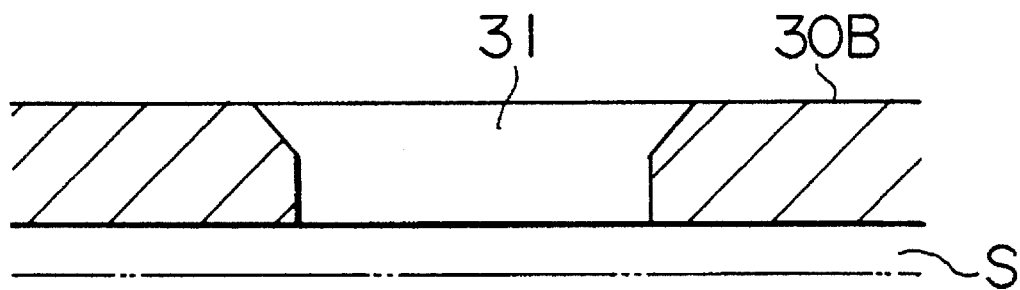
FIG. 11 is an enlarged cross sectional view showing a modification of printing plate 30B.

As the aforementioned material (2), in which openings are formed in a ferromagnetic, metallic thin plate, a material can be used which is formed by punching a thin plate of a ferromagnetic metal such as soft iron, cobalt alloy, nickel alloy, and the like, working this plate by means of a procedure such as laser working, etching, or the like, and then constructing openings (ink-penetrating portion) forming the print pattern. It is also possible to laminate a mesh screen for reinforcement onto this metallic thin plate in which openings are formed. In particular, in this aforementioned case, as shown in FIGS. 9~11, it is also possible to chamfer the peripheral edges of opening 31 on the contact surface side with the squeegee so that an obtuse angle is formed. By means of chamfering in this manner, even in the case when printing plate 30B is thick, it is possible for ink I to flow easily through the interior of opening 31, thereby further improving the effects of the present invention.

When using the screen printing apparatus formed from the aforementioned structure, opening/closing cylinder 14 is initially activated; opening/closing base 2 is then raised and opened; sheet S is placed on sheet support mechanism 20; and plate unit 30 is affixed to brackets 32 and Subsequently, sheet S is adhered to sheet support mechanism 20 by activating decompression pump 22, and opening/closing base 2 then closes. Furthermore, slider 46 and ink imprinting mechanism 42 are activated towards the front end of opening/closing base 2, first squeegee 64A is lowered by means of first cylinder 58A, and the required amount of ink is then supplied to the rear end of first squeegee 64A.

Figure 7:
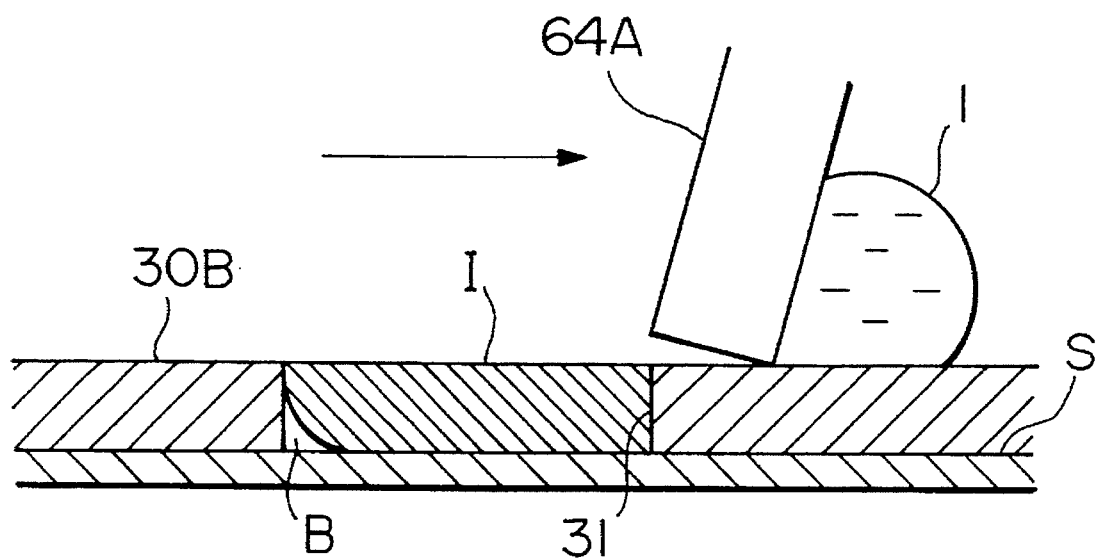
FIG. 7 is an enlarged cross sectional view showing the action of first squeegee 64A.
Figure 8:
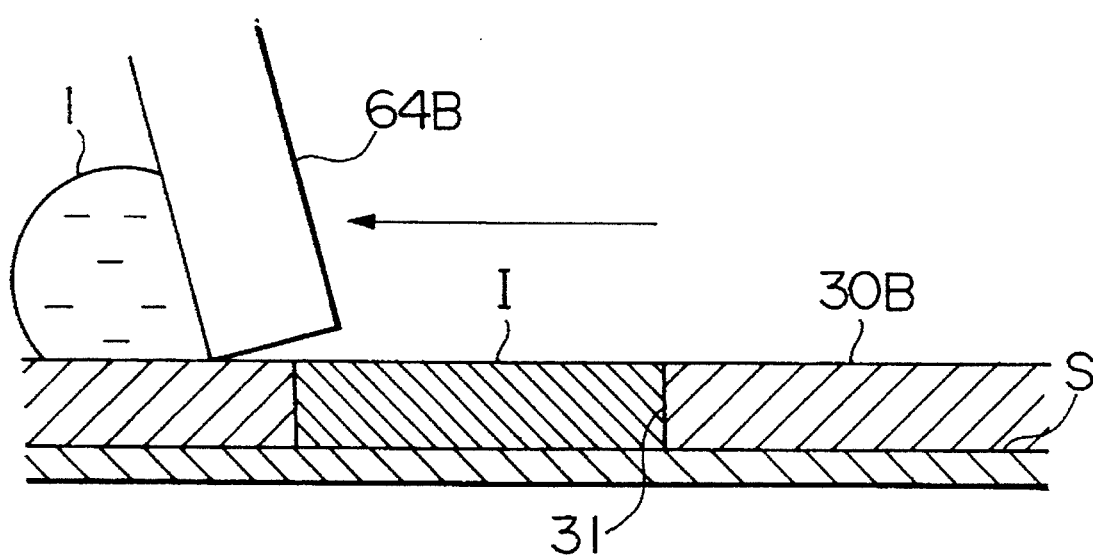
FIG. 8 is an enlarged cross sectional view showing the action of a second squeegee 64B.

Slider 46 is then slid backwards by means of rotating belt 48, and ink I is then spread by means of first squeegee 64A as shown in FIG. 7. At this time, first squeegee 64A is tilted so as to form an acute angle with printing plate 30B in the direction of progress thereby providing a high ink pressing force. This effect is similarly observed with regard to second squeegee 64B to be described hereinafter. Furthermore, at the time of imprinting, it is also possible to press squeegee 64A (or 64B) onto printing plate 30B at a fixed pressure by means of cylinder 58A (or 58B). At the completion point of spreading using first squeegee 64A, in the case when a thick printing plate 30B is employed, space B is easily generated without sufficient packing of ink I along the edges of the front end of ink penetrating portion 31.

At this point, when slider 46 reaches the rear end of guide rod 44, first squeegee 64A is withdrawn, and second squeegee 64B is lowered. Slider 46 is then moved towards the front end of closing base 42. The ink I remaining on printing plate 30B is then transported by means of second squeegee 64B and once again packed onto ink penetrating portion 31. Therefore, ink I is forced into space B of ink penetrating portion 31, and the ink I can then be packed uniformly across the entire region of ink penetrating portions 31. In cases in which printing plate 30B is particularly thick, it is also possible to activate ink imprinting mechanism 42 two or more times (round-trips) per single printing.

When imprinting of ink I is completed by means of ink imprinting mechanism 42, the supply of electricity to electromagnet 78 is stopped, and opening/closing base 2 is opened by means of opening/closing cylinder 14. Furthermore, decompression pump 22 is halted, and sheet S is peeled from sheet support mechanism 20, thereby completing one screen printing cycle.

Since ink I can be spread in both directions by means of first and second squeegees 64A and 64B according to this type of screen imprinting apparatus, even in the case when printing plate 30B is thick, it is possible to uniformly pack ink I over the entire region of ink penetrating portion 31 of printing plate 30B to obtain high quality printing without smudges and the like.

In addition, according to this type of screen printing apparatus, printing plate 30B is attracted towards and affixed to sheet S by means of electromagnets 78 within sheet support mechanism 20; thus, even when squeegees 64A and 64B are strongly rubbed against printing plate 30B, it is difficult for misalignment to occur between sheet material S and printing plate 30B. Consequently, even in the case when a thick printing plate 30B requiring a large squeegee pressure and possessing a poor adhesion with respect to sheet material S is employed, it is still possible to conduct highly precise printing while preventing misalignment and blotting of the print.

Furthermore, the screen printing apparatus of the present invention is not limited to the aforementioned examples, as it is also possible to add various modifications as required. For example, instead of employing two cylinders as the squeegee switch mechanism, it is possible to achieve a structure in which each squeegee is connected to one side of a lever such that this lever can be tilted like a seesaw by means of using a single actuator.

In addition, the present invention is not limited to use in printing ink onto a paper, as it is also possible to employ as the ink, for example, cream solder formed by dispersing fine solder particles in flux or in an organic solvent; resist material used as a mask for manufacture of printed boards; resin raw materials in their non-hardened state; and the like. According to the apparatus of the present invention, it is possible to precisely form a thick ink film, and thus this apparatus is, in particular, appropriate for use in printing the aforementioned materials in, for example, the manufacturing processes of printed boards, semiconductor components, and the like.

Finally, by mixing the fine powder of the aforementioned ferromagnetic material into ink I, it is possible to improve the discharge properties of the ink from the ink penetrating portion by means of attracting the ink maintained within the aforementioned ink penetrating portion towards sheet material S using magnetic force.

What is claimed is:

1. A screen printing apparatus comprising:

a printing plate formed from a material incorporating a ferromagnetic substance and in which an ink penetrating portion is formed possessing the shape of the print;

a support means for supporting material to undergo printing equipped with a magnetic force generating means for attracting said printing plate through said material to undergo printing;

a printing plate housing means for housing said printing plate at a position in contact with said material to undergo printing;

a slider which is capable of bi-directional horizontal movement with respect to said printing plate;

a slider driving means for driving said slider bi-directionally;

a first squeegee and a second squeegee for spreading over said printing plate ink supplied to said printing plate; and a squeegee switch means installed in said slider for supporting said first squeegee and said second squeegee, and for selecting one of said first squeegee and said second squeegee, and placing a selected squeegee in contact with said printing plate.

2. A screen printing apparatus according to claim 1, wherein said first squeegee and said second squeegee are connected to said squeegee switch means such that said first squeegee and said second squeegee can be tilted in the direction of movement of said slider; in this manner, at the time of spreading ink, an acute angle is normally maintained between said printing plate and said squeegee on the side of said squeegee facing the direction of progress.

3. A screen printing apparatus according to claim 1, wherein said printing plate is a plate formed from a metal possessing ferromagnetic properties.

4. A screen printing apparatus according to claim 1, wherein said ink penetrating portion of said printing plate is constructed from openings forming a print pattern; the peripheral edges of said openings on a contact side with said squeegee are chamfered.

5. A screen printing apparatus according to claim 1, further comprising a control means for controlling said slider driving means and said squeegee switch means; said control means spreads ink supplied to said printing plate bi-directionally by means of initially selecting and placing into contact with said printing plate one of said first squeegee and said second squeegee via activating said squeegee switch means; and when said selected squeegee is moved to the end of said other squeegee by means of said slider driving means, said control means places said other squeegee in contact with said printing plate and moves said other squeegee towards the end of said initially-selected squeegee.

6. A screen printing apparatus according to claim 1, wherein said support means comprises a support surface for supporting said material to undergo printing, and a decompression means for drawing air from intake holes opening on said support surface.

7. A screen printing apparatus comprising:
- a printing plate formed from a material incorporating a ferromagnetic substance and in which an ink penetrating portion is formed possessing the shape of the print;
- a support means for supporting material to undergo printing equipped with a magnetic force generating means for attracting said printing plate through said material to undergo printing, said magnetic force generating means comprising a plurality of electromagnets and a current supply means for supplying current to said plurality of electromagnets;
- a printing plate housing means for housing said printing plate at a position in contact with said material to undergo printing;
- a slider which is capable of bi-directional horizontal movement with respect to said printing plate;
- a slider driving means for driving said slider bi-directionally;
- a first squeegee and a second squeegee for spreading over said printing plate ink supplied to said printing plate; and
- a squeegee switch means installed in said slider for supporting said first squeegee and said second squeegee, and for selecting one of said first squeegee and said second squeegee, and placing a selected squeegee in contact with said printing plate.

8. A screen printing apparatus according to claim 7, wherein said current supply means supplies current to only a section of said electromagnets when spreading of ink is not performed, and said current supply means supplies current to the entirety of said electromagnets only when said ink is spread over said printing plate.

9. A screen printing apparatus comprising:
- a printing plate formed from a material incorporating a ferromagnetic substance and in which an ink penetrating portion is formed possessing the shape of the print;
- a support means for supporting material to undergo printing equipped with a magnetic force generating means for attracting said printing plate through said material to undergo printing said magnetic force generating means comprising a plurality of electromagnets, a plurality of permanent magnets, and a current supply means for supplying current to said plurality of electromagnets;
- a printing plate housing means for housing said printing plate at a position in contact with said material to undergo printing;
- a slider which is capable of bi-directional horizontal movement with respect to said printing plate;
- a slider driving means for driving said slider bi-directionally;
- a first squeegee and a second squeegee for spreading over said printing plate ink supplied to said printing plate; and
- a squeegee switch means installed in said slider for supporting said first squeegee and said second squeegee, and for selecting one of said first squeegee and said second squeegee, and placing a selected squeegee in contact with said printing plate.

10. A screen printing apparatus according to claim 9, wherein said current supply means supplies current to said electromagnets only when said ink is spread over said printing plate.

11. A screen printing apparatus comprising:
- a printing plate formed by means of dispersing and affixing a powder of a ferromagnetic substance into a binding material and in which an ink penetrating portion is formed possessing the shape of the print;
- a support means for supporting material to undergo printing equipped with a magnetic force generating means for attracting said printing plate through said material to undergo printing;
- a printing plate housing means for housing said printing plate at a position in contact with said material to undergo printing;
- a slider which is capable of bi-directional horizontal movement with respect to said printing plate;
- a slider driving means for driving said slider bi-directionally;
- a first squeegee and a second squeegee for spreading over said printing plate ink supplied to said printing plate; and
- a squeegee switch means installed in said slider for supporting said first squeegee printing and said second squeegee and for selecting one of said first squeegee and said second squeegee, and placing a selected squeegee in contact with said printing plate.

* * * * *

UNITED STATES PATENT AND TRADEMARK OFFICE
CERTIFICATE OF CORRECTION

PATENT NO. : 5,476,039
DATED : December 19, 1995
INVENTOR(S) : Hiruta et al.

It is certified that error appears in the above-identified patent and that said Letters Patent is hereby corrected as shown below:

```
Column 1, line 12, delete ":" (colon).

Column 7, line 2, delete "and Subsequently," insert -- and 36.
      Subsequently,--.

Column 10, line 1, (Claim 9, line 8), after "printing" insert
      --,-- (comma);

line 48, (Claim 11, line 21), delete "printing"; and line 49, (Claim 11, line 22), after "squeegee" (first
      occurrence), insert --,-- (comma).
```

Signed and Sealed this

Eleventh Day of June, 1996

Attest:

BRUCE LEHMAN

*Attesting Officer*   *Commissioner of Patents and Trademarks*